(12) United States Patent
Su et al.

(10) Patent No.: US 12,463,635 B2
(45) Date of Patent: Nov. 4, 2025

(54) AMPLIFIER WITH OUTPUT AC COUPLED ENVELOPE TRACKING SUPPLY

(71) Applicant: Avago Technologies International Sales Pte. Limited, Singapore (SG)

(72) Inventors: Feng Su, San Jose, CA (US); Yue Hu, San Jose, CA (US); Tom W. Kwan, Cupertino, CA (US); Guo Wen Wei, Saratoga, CA (US); Fang Lin, San Jose, CA (US); Iuri Mehr, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 166 days.

(21) Appl. No.: 18/360,413

(22) Filed: Jul. 27, 2023

(65) Prior Publication Data

US 2025/0038744 A1 Jan. 30, 2025

(51) Int. Cl.
*H03K 17/22* (2006.01)
*H03K 17/687* (2006.01)
*H03K 19/0185* (2006.01)

(52) U.S. Cl.
CPC ......... *H03K 17/223* (2013.01); *H03K 17/687* (2013.01); *H03K 19/018514* (2013.01); *H03K 19/018585* (2013.01)

(58) Field of Classification Search
CPC ............... H03K 17/223; H03K 17/687; H03K 19/018514; H03K 19/018585; H03F 1/0233; H03F 1/0255
See application file for complete search history.

(56) References Cited

U.S. PATENT DOCUMENTS

| 10,158,328 B2 | 12/2018 | Nobbe et al. | |
| 2014/0232271 A1* | 8/2014 | Wiegele | H05B 45/3725 315/127 |

OTHER PUBLICATIONS

Foreign Search Report on non-Foley case related to US DTD Dec. 18, 2024.

* cited by examiner

*Primary Examiner* — Metasebia T Retebo
(74) *Attorney, Agent, or Firm* — Foley & Lardner LLP

(57) ABSTRACT

A device including a first circuit, a second circuit, and a third circuit. The first circuit to receive a first signal and a second signal, and the first circuit to provide a third signal. The second circuit to receive a fourth signal and a fifth signal, and the second circuit to provide a sixth signal. The third circuit to receive the third signal and the sixth signal, and the third circuit to provide a seventh signal to indicate whether to track a difference between an amount of voltage provide to a driver and an amount of voltage provided by the driver or track a difference between an amount of voltage provided by a source and the amount of voltage provided to the driver.

19 Claims, 8 Drawing Sheets

AMPLIFIER WITH OUTPUT AC COUPLED ENVELOPE TRACKING SUPPLY

BACKGROUND

The present disclosure is related to amplification of signals and amplifiers. Amplifiers can have multiple classes and each class of amplifier can have different characteristics.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
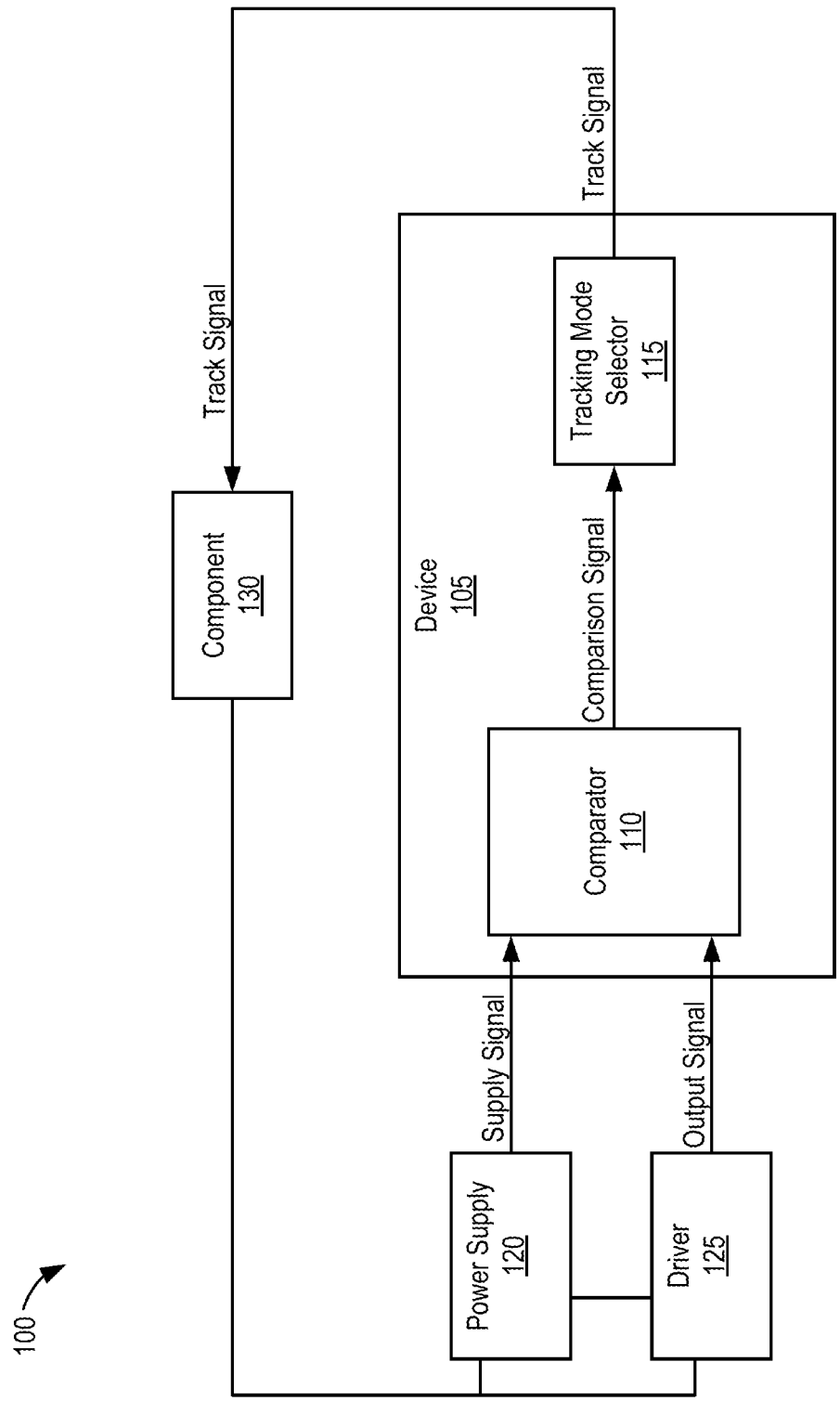
FIG. 1 is a block diagram of a system for use in output tracking, according to some embodiments.

Some embodiments are related to systems and methods for output signal tracking for amplifiers. Output signal tracking may refer to and/or include envelope tracking, power supply tracking, and power supply modification. Output signal tracking may include monitoring, analyzing, recording, and/or otherwise evaluating output signals of amplifiers. For example, output signal tracking may include receiving an output signal from an amplifier and comparing a value of the output signal with an amount of power and/or an amount of voltage provided to the amplifier. Tracking values of output signals provided by amplifiers may allow for the efficiency of the amplifier to be improved.

An amplifier is generally electrically coupled to a power supply and the power supply provides power to the amplifier. The power supply generally provides the power to the amplifier at a given voltage or current level (e.g., 0.7 volts, 1 volt, 5 volts, 10 volts, 12 volts, etc.). The given voltage or current may be Direct Current (DC), Alternating Current (AC), and/or other varying combinations. The voltage level or current level provided to the amplifier can impact the efficiency of the amplifier. For example, the level of voltage provided to power supply terminals of the amplifier may establish an output range for the amplifier (e.g., the output of the amplifier may be unable to exceed the amount of power (e.g., voltage level) provided to the amplifier from the power supply). Additionally, characteristics of input signals may also impact the efficiency of the amplifier.

According to one example, an amplifier may receive a signal at a voltage level of 3 volts and receive power at its power terminals at a voltage level of 12 volts. The amplifier and/or a circuit including the amplifier may have a given gain factor which impacts the voltage level of the output signal provided by the amplifier. For example, the amplifier may have a gain factor of 2 meaning that the amplifier may be able to produce an output signal having a voltage level of 6 volts responsive to the amplifier receiving an input signal having a voltage level of 3 volts. In this example, the efficiency of the amplifier may be reduced because the amplifier receives power at the 12V level when it only produces output signals at a voltage level of 6V based on the input signal and the power level.

Some technical solutions and advantages of some embodiments are related to a system including a device that can track levels of the input signals provided to the amplifier and compare the levels of the input signals with levels of the power signals provided to the power supply terminals of the amplifier and/or compare the levels of the input signals with levels of signals provided by the driver (e.g., amplified output signals). The device can control and/or otherwise change the amount of voltage provided to the power supply terminals to adjust and/or otherwise change the efficiency of the amplifier. The device can include at least one circuit. For example, the device can include a first circuit, a second circuit, and a third circuit. The first circuit and the second circuit can receive signals corresponding to different amounts of power that can be provided to the amplifier (e.g., a driver) by at least one source. For example, the different amounts of power can be provided by a first source and/or a second source. The first circuit and the second circuit can also receive signals provided by the driver. For example, the first circuit and the second circuit can receive output signals provided by the driver. The first circuit and the second circuit can produce signals that indicate comparisons between the signals and the produced signals can be provided to the third circuit. The third circuit can track and/or otherwise monitor the signals produced by the first and second circuit and the third circuit, responsive to monitoring the signals, can produce signals that can control the amount of voltage provided to the driver.

The device can be in communication with an amplifier (e.g., the driver). The communication between the device and the driver can be direct (e.g., the devices is directly connected to the driver and the device directly communicates with the driver) and/or indirect (e.g., a component receives signals from the driver and the component provides the signals to the device) in some embodiments. The communication between the device and the driver can include the device and driver being electrically coupled with one another. The device can also be in similar communication with a power supply and/or power supply device that can provide power to the supply terminals of the driver. The device can provide signals that cause an amount of voltage provided to the supply terminals of the driver to be controlled and/or otherwise adjusted.

The system may refer to and/or include at least one of Application-Specific Integrated Circuits (ASIC), capacitive load components, display drivers, touch screens, keyboard sensors, mobile devices, and/or among other possible touch controllers. The device may refer to and/or include at least one an integrated circuit, a general purpose processor, a multicore processor, a software programmable device, a programmable logic controller, and/or among other possible circuitry and/or hardware, in some embodiments. Similarly, the functionality of the device may be stored, in memory, as software and/or as instructions and when the information (e.g., the software and/or instructions) stored in memory are executed, by a processor, results in the processor performing the functionality of the device (e.g., the processor can monitor output signals and control an amount of voltage provided to the driver) and/or performing the functionality of a component of the device (e.g., the first circuit, the second circuit, and/or the third circuit).

The first circuit may refer to and/or include at least one of an operational amplifier (Opamp), a comparator circuit, an integrated circuit, a software programmable device, a programmable logic controller, and/or among other possible circuitry and/or hardware, in some embodiments. The second circuit may refer to and/or include at least one of an Opamp, a comparator circuit, an integrated circuit, a software programmable device, a programmable logic controller, and/or among other possible circuitry and/or hardware, in some embodiments. The third circuit may refer to and/or include at least one of an Opamp, a comparator circuit, filters, a digital signal processing engine, a pattern generator (e.g., a device that sends control signals to components of the device and/or the system), Flip Flops, logic gates, latches, state storage, an integrated circuit, a software programmable device, a programmable logic controller, and/or among other possible circuitry and/or hardware, in some embodiments.

The driver may refer to and/or include at least one of a driver circuit, an integrated circuit, an Opamp, a regulator, a software programmable device, a programmable logic controller, and/or among other possible circuitry and/or hardware, in some embodiments. The first source may refer to and/or include at least one of a power supply device, passive electronic components, power storage devices, power rails, and/or among other possible circuitry and/or hardware, in some embodiments. The second source may refer to and/or include at least one of a power supply device, passive electronic components, power storage devices, power rails, and/or among other possible circuitry and/or hardware, in some embodiments. A level may refer to and/or include at least one of a voltage level of a signal, an amount of voltage of a signal, an amount of power of a signal, an amount of current of a signal, and/or various combinations, in some embodiments. A difference may refer to and/or include an indication of which signal (e.g., a first signal or a second signal) is larger and/or smaller from each other, a binary value (e.g., a zero or a one) to indicate whether a first signal is higher and/or lower than a second signal, and/or among various combinations, in some embodiments. A difference may also refer to a mathematical difference between two or more signals (e.g., a larger signal minus a smaller signal), in some embodiments. A first component may refer to and/or include at least one of a voltage source (e.g., batteries, current through resistors, etc.), circuitry hardware (e.g., transistors, resistors, capacitors, inductors, diodes, etc.), and/or among various combinations, in some embodiments.

Some embodiments relate to a system. The system can include a device. The device can include a first circuit, a second circuit, and a third circuit. The first circuit can receive a first signal to indicate a first amount of voltage provided by a first source. The first circuit can also receive a second signal to indicate a second amount of voltage provided to a driver, and provide a third signal, the third signal can have a first level in response to a level of the first signal being larger than a level of the second signal, and the third signal can have a second level in response to the level of the second signal being larger than the level of the first signal. The second circuit can receive a fourth signal to indicate a third amount of voltage provided by the driver. The second circuit can also receive a fifth signal to indicate the second amount of voltage, and provide a sixth signal, the sixth signal can have a first level in response to a level of the fourth signal being larger than a level of the fifth signal and the sixth signal can have a second level in response to the level of the fifth signal being larger than the level of the fourth signal. The third circuit can receive the third signal and the sixth signal, and provide a seventh signal to indicate whether to track a difference between the second amount of voltage and the third amount of voltage or track a difference between the first amount of voltage and the second amount of voltage.

In some embodiments, the first source can electrically couple with a terminal of the driver, and the first source can provide a first level of the second amount of voltage. A second source can electrically couple with the terminal of the driver, and the second source provide a second level of the second amount of voltage. A first component, in response to the seventh signal having a first level, can electrically decouple the first source from the terminal of the driver, and electrically couple the second source with the terminal of the driver.

In some embodiments, the level of the second signal can have a first level in response to the first source providing the first level of the second amount of voltage. The second signal can have a second level in response to the second source providing the second level of the second amount of voltage, and the second level of the second signal can be larger than the first level of the second signal.

In some embodiments, the first component, in response to the seventh signal having a second level, can electrically decouple the second source from the terminal of the driver, and electrically couple the first source with the terminal of the driver. The second circuit can receive the fourth signal in response to the first source providing the first level of the second amount of voltage or in response to the second source providing the second level of the second amount of voltage.

In some embodiments, a first component can electrically couple the driver with the first source in response to the seventh signal having a first level. A second component can electrically couple the driver with a second source in response to the seventh signal having a second level.

In some embodiments, the fourth signal can have a first range in response to the first source providing a first level of the second amount of voltage. The fourth signal can have a second range in response to a second source providing a second level of the second amount of voltage, and the first range can be different than the second range.

In some embodiments, the second signal can indicate a supply voltage for the driver and the supply voltage can dictate a range for the driver.

In some embodiments, a first component, in response to the seventh signal having a first level, can electrically couple a second component with the first circuit to adjust the level of the first signal from a first level to a second level, and produce, responsive to adjustment of the first signal from the first level to the second level, a threshold between the first signal and the second signal.

In some embodiments, a second component can electrically couple with the second circuit. The second component can also adjust the level of fifth signal from a first level to a second level, and produce, responsive to adjustment of the fifth signal from the first level to the second level, a threshold between the fifth signal and the fourth signal.

In some embodiments, the seventh signal can have a first level to indicate tracking the difference between the second amount of voltage and the third amount of voltage, and the seventh signal can have a second level to indicate tracking the difference between the first amount of voltage and the second amount of voltage.

Some embodiments relate to a device. The device can include a first circuit, a second circuit, and a third circuit. The first circuit can receive a first signal to indicate a first amount of voltage provided by a first source. The first circuit can also receive a second signal to indicate a second amount of voltage provided to a driver, and provide a third signal, the third signal can have a first level in response to a level of the first signal being larger than a level of the second signal and the third signal can have a second level in response to the level of the second signal being larger than the level of the first signal. The second circuit can receive a fourth signal to indicate a third amount of voltage provided by the driver. The second circuit can also receive a fifth signal to indicate the second amount of voltage, and provide a sixth signal, the sixth signal can have a first level in response to a level of the fourth signal being larger than a level of the fifth signal and the sixth signal can have a second level in response to the level of the fifth signal being larger than the level of the fourth signal. The third circuit can receive the third signal and the sixth signal, and provide a seventh signal to indicate whether to track a difference between the second amount of voltage and the third amount of voltage or track a difference between the first amount of voltage and the second amount of voltage.

In some embodiments, the first source can electrically couple with a terminal of the driver, and provide a first level of the second amount of voltage. A second source can electrically couple with the terminal of the driver, and provide a second level of the second amount of voltage. A first component, in response to the seventh signal having a first level, can electrically decouple the first source from the terminal of the driver, and electrically couple the second source with the terminal of the driver.

In some embodiments, the level of the second signal can have a first level in response to the first source providing the first level of the second amount of voltage. The second signal can have a second level in response to the second source providing the second level of the second amount of voltage, and the second level of the second signal can be larger than the first level of the second signal.

In some embodiments, the first component, in response to the seventh signal having a second level, can electrically decouple the second source from the terminal of the driver, and electrically couple the first source with the terminal of the driver. The second circuit can receive the fourth signal in response to the first source providing the first level of the second amount of voltage or in response to the second source providing the second level of the second amount of voltage.

In some embodiments, a first component can electrically couple the driver with the first source in response to the seventh signal having a first level. A second component can electrically couple the driver with a second source in response to the seventh signal having a second level.

In some embodiments, the fourth signal can have a first range in response to the first source providing a first level of the second amount of voltage. The fourth signal can have a second range in response to a second source providing a second level of the second amount of voltage, and the first range can be different than the second range.

In some embodiments, the second signal can indicate a supply voltage for the driver and the supply voltage can dictate a range for the driver.

In some embodiments, a first component, in response to the seventh signal having a first level, can electrically couple a second component with the first circuit to adjust the level of the first signal from a first level to a second level, and produce, responsive to adjustment of the first signal from the first level to the second level, a threshold between the first signal and the second signal.

Some embodiments relate to a method for tracking signals of a driver. The method can include receiving, by a first circuit, a first signal and a second signal. The first signal can indicate a first amount of voltage provided by a first source and the second signal can indicate a second amount of voltage provided to the driver. The method can also include providing, by the first circuit, a third signal, the third signal can have a first level in response to a level of the first signal being larger than a level of the second signal and the third signal can have a second level in response to the level of the second signal being larger than the level of the first signal. The method can also include receiving, by a second circuit, a fourth signal and a fifth signal. The fourth signal can indicate a third amount of voltage provided by the driver, and the fifth signal can indicate the second amount of voltage. The method can also include providing, by the second circuit, a sixth signal, the sixth signal can have a first level in response to a level of the fourth signal being larger than a level of the fifth signal and the sixth signal can have a second level in response to the level of the fifth signal being larger than the level of the fourth signal. The method can also include receiving, by a third circuit, the third signal and the sixth signal, and providing, by the third circuit, a seventh signal to indicate whether to track a difference between the second amount of voltage and the third amount of voltage or track a difference between the first amount of voltage and the second amount of voltage.

In some embodiments, the level of the second signal can have a first level in response to the first source providing the first level of the second amount of voltage. The second signal can have a second level in response to the second source providing the second level of the second amount of voltage, and the second level of the second signal can be larger than the first level of the second signal.

FIG. 1 depicts a block diagram of a system 100, according to some embodiments. In some embodiments, the system 100 includes at least one device 105, at least one power supply 120, at least one driver 125, and at least one component 130. The power supply 120 can be and/or include at least one of the power sources and/or power supply described herein. For example, the power supply 120 can provide power to a power supply terminal of the driver 125 (e.g., to a pair of power supply terminals (e.g., positive, negative, power, ground, etc.)). The power supply 120 can also provide an input signal to the device 105. The power supply 120 can include a converter circuit, a regulator, a battery, a storage capacitor, or any apparatus for providing a power signal. The driver 125 can be and/or include the driver described herein. For example, the driver 125 can provide an output signal to the device 105.

The device 105 can be and/or include the device described herein. In some embodiments, the device 105 includes one or more comparators 110 and one or more tracking mode selectors 115. The comparators 110 can be and/or include at least one of the circuits described herein. The tracking mode selectors 115 can be and/or include at least one of the circuits described herein. The comparators 110 can receive one or more signals. For example, the comparators 110 can receive one or more signals from the power supplies 120 (indicated as Supply Signal) and the comparators 110 can receive one or more signals from the driver 125 (indicated as Output Signal in FIG. 1).

The Supply Signal may refer to, correspond to, and/or otherwise indicate at least one of an amount of voltage (e.g., a voltage level and/or a voltage amount) and/or an amount of power that is provided to at least one power supply terminal (e.g., a terminal) of the driver 125. For example, the power supply terminals of the driver 125 may receive, from the power supplies 120, an amount of power that includes a voltage level (e.g., an amount of voltage) of a given amount and/or value. The voltage level included in the amount of power that is provided to the supply terminals of the driver 125 may also be provided to the comparators 110 (e.g., as the Supply Signals). The Supply Signals may also refer to, correspond to, and/or otherwise indicate an amount of power and/or an amount of voltage that is carried by a rail or line (e.g., a voltage level of a supply line produced by the power supplies 120).

The Output Signals may refer to, correspond to, and/or otherwise indicate an amount of power and/or an amount of voltage that is provided by the driver 125. For example, the driver 125 may receive a signal and then provide an amplified signal. The amplified signal may include a voltage level of a given amount and/or value. The voltage level that is included in the amplified signal (e.g., the amount of power provided by the driver 125) may also be provided to the comparators 110 (e.g., as the Output Signals).

The comparators 110 can receive a signal to indicate an amount of voltage provided by a power source. For example, the comparators 110 can receive a first Supply Signal indicating an amount of voltage provided by a first power supply 120 to a supply line or a voltage rail. The first Supply signal may include a voltage level that indicates the amount of voltage provided by the first power supply 120. The comparators 110 can also receive a signal to indicate an amount of voltage provided to the driver 125. For example, the comparators 110 can receive a second Supply Signal indicating an amount of voltage provided to a supply terminal of the driver 125. The second Supply Signal may include a voltage level that indicates the amount of voltage provided to the supply terminal of the driver 125.

The Supply Signals can have one or more levels. For example, the second Supply Signal can have a first level and a second level. The second Supply Signal can have the first level when the first power supply 120 is providing a first level of an amount of voltage to the driver 125. The second Supply Signal can have the second level when a second power supply 120 is providing a second level of an amount of voltage to the driver 125. The second level can be different from the first level (e.g., a voltage level included in the amount of voltage provided by the second power supply 120 can be different (e.g., larger or smaller) than a voltage level included in the amount of voltage provided by the first power supply 120).

The comparators can receive a signal to indicate an amount of voltage provided by the driver 125. For example, the comparators can receive a first Output Signal indicating an amount of voltage provided by the driver 125. The first Output Signal may include a voltage level that indicates the amount of voltage provided by the driver 125.

The comparators 110 can also provide one or more signals. For example, the comparators 110 can provide one or more signals to the tracking mode selectors 115 (indicated as Comparison Signal in FIG. 1). The comparators 110 can compare one or more signals to determine which signal is larger and/or smaller. For example, the comparators 110 can compare the first Supply Signal with the first Output Signal to determine which signal is larger. The comparators 110 may also compare the first Supply Signal with the second Supply Signal.

The comparators 110 can provide a signal to indicate a difference between an amount of voltage provided by a first source (e.g., the power supplies 120) and an amount of voltage provided to a driver (e.g., the driver 125). For example, the comparators 110 can provide a first Comparison Signal to indicate a difference between the first Supply Signal and the second Supply Signal. The comparators 110 may also provide a second Comparison Signal to indicate a difference between the second Supply Signal and the first Output Signal.

The first Comparison Signal can have a first level in response to the first Supply signal being larger than the second Supply Signal. The first Comparison Signal can have a second level in response to the second Supply Signal being larger than the first Supply Signal. The first level and the second level may include a voltage level. For example, the first Comparison signal having a voltage level of 0V (e.g., the first level) may indicate that the first Supply Signal is larger than the Second Supply Signal and the first Comparison Signal having a voltage level of 1V (e.g., the second level) may indicate that the Second Supply Signal is larger than the first Supply signal.

The second Comparison Signal can have a first level when the first Output Signal is larger than the second Supply Signal. The second Comparison Signal can have a second level when the second Supply Signal is larger than the first Output Signal. The first level and the second level may include a voltage level. For example, the second Comparison signal having a voltage level of 1V (e.g., the first level) may indicate that the first Output Signal is larger than the second Supply Signal and the second Comparison Signal having a voltage level of 0V (e.g., the second level) may indicate that the second Supply Signal is larger than the first Output Signal.

As a non-limiting example, the first Supply Signal may include a voltage level of 5V and the second Supply Signal may include a voltage level of 8V. In this example, the comparators 110 can determine that the second Supply Signal is larger than the first Supply Signal. The comparators 110 can provide the first Comparison Signal to indicate the difference between the first Supply Signal and the second Supply Signal. For example, the first Comparison Signal may have the second value to indicate that the second Supply Signal is larger than the first Supply Signal.

While the examples described herein, with respect to comparing and/or determining differences between signals (e.g., which signal is larger and/or smaller), pertained to signals including voltage levels greater than and/or equal to 0 (e.g., positive values), the comparison of the signals may include voltage levels less than 0 (e.g., negative values). When signals include voltage levels having negative values, the comparison between signals may be absolute and/or relative. For example, the signal having a voltage level closer to 0V (e.g., less negative) may be determined to be the signal having the largest value. Additionally, the absolute value of the voltage levels can be taken and then signal having the biggest voltage level, after taking the absolute value, can be determined to be the largest signal.

As described herein, the efficiency of drivers and/or amplifiers (e.g., the driver 125) can be based on the amount of voltage provided to the supply terminals and the values of the outputs produced by the amplifiers, according to some embodiments. In some embodiments, the tracking mode selector 115 can provide the technical solution described herein by monitoring the supply terminal voltages (e.g., the Supply Signals described herein) and the output signals (e.g., the Output Signals described herein) of the driver 125 to determine when the first power supply 120 or the second power supply 120 can provide power to the supply terminals of the driver 125. For example, the first power supply 120 can provide 5 volts to the supply terminals of the driver 125 and the second power supply 120 can provide 10 volts to the supply terminals of the driver 125. The tracking mode selector 115 can control the efficiency of the driver 125 by having the first power supply 120 provide power to the driver 125 when the output of the driver 125 is below 5 volts and by having the second power supply 120 provide power to the driver 125 as the output of the driver 125 is approaching a predetermined threshold at or around 5 volts.

The components 130 can be and/or include at least one of transistors, diodes, circuit switches, latches, passive elements (e.g., resistors, inductors, capacitors, etc.), voltage sources, current sources, and/or among other possible hardware and/or circuit elements. The transistors can include Metal-Oxide-Semiconductor Field-Effect Transistors (MOSFETs), Complementary Metal-Oxide-Semiconductors (CMOS), and/or among other possible types of transistors. The voltage sources can include power supplies such as batteries and/or current flowing through a resistor.

The tracking mode selectors 115 can receive one or more signals. For example, the tracking mode selectors 115 may receive the first Comparison Signal and the second Comparison Signal. The tracking mode selector 115 can determine, based on the first Comparison Signal and the second Comparison Signal, when to track a difference between the amount of voltage provided to a terminal of a driver (e.g., the amount of voltage provided to the supply terminal of the driver 125) and the amount of voltage provided by the driver (e.g., the amount of voltage included in the amplified Output Signals of the driver 125). The tracking mode selector 115 can also determine, based on the first Comparison Signal and the second Comparison Signal, when to track a difference between the amount of voltage provided by a source (e.g., the power supply 120) and the amount of voltage provided to the supply terminal of the driver 125. For example, the tracking mode selectors 115 can determine to track the difference between the first Supply Signal and the second Supply Signal when the second power supply 120 is providing power to the supply terminal of the driver 125. In this example, the tracking mode selectors 115 can track the first Supply Signal and the second Supply Signal to determine when the supply voltage (e.g., the amount of voltage provided to the driver 125) can be switch from the voltage level provided by the second power supply 120 to the voltage level provided by the first power supply 120.

The tracking mode selectors 115 can provide one or more signals. For example, the tracking mode selectors 115 can provide signals to the components 130. The signals provided by the tracking mode selectors 115 are indicated as Track Signal in FIG. 1. The tracking mode selectors 115 can provide the Track Signals to the components 130. The Track Signals can cause the components 130 to electrically decouple and/or electrically couple one of the power supplies 120 with the driver 125. For example, the Track Signals can cause the components 130 to electrically couple the first power supply 120 with the terminal of the driver 125 and the Track Signals can cause the components 130 to electrically decouple the second power supply 120 from the terminal of the driver 125. For example, the components 130 can include MOSFETs and the Track Signals can have a given level (e.g., a given voltage level, a given amount of voltage, a given amount of power, and/or a given amount of current), and the given level of the Track Signals can cause current flow through the MOSFETs to switch from a first path to a second path. The Track Signals can also activate and/or deactivate switches (e.g., open and/or close a portion or a path of a circuit).

The signals described herein can be at least one of sequential signals (e.g., the first signal is followed by the second signal, etc.), continuous signals (e.g., the first signal is continually provided but the value of the first signal may change), semi-continuous signal (e.g., the first signal is provided intermittently responsive to a value of the first signal changing), non-consecutive signals (e.g., the first signal is not immediately followed by the second signal), and/or among other possible combinations. For clarity, when a first power supply and a second power supply are discussed herein the first power supply may have a lower voltage value in comparison to a voltage value of the second power supply. However, the power supplies described herein can have and/or include varying voltage values, voltage types (e.g., AC, DC, etc.), varying configuration, and/or various locations.

Figure 2:
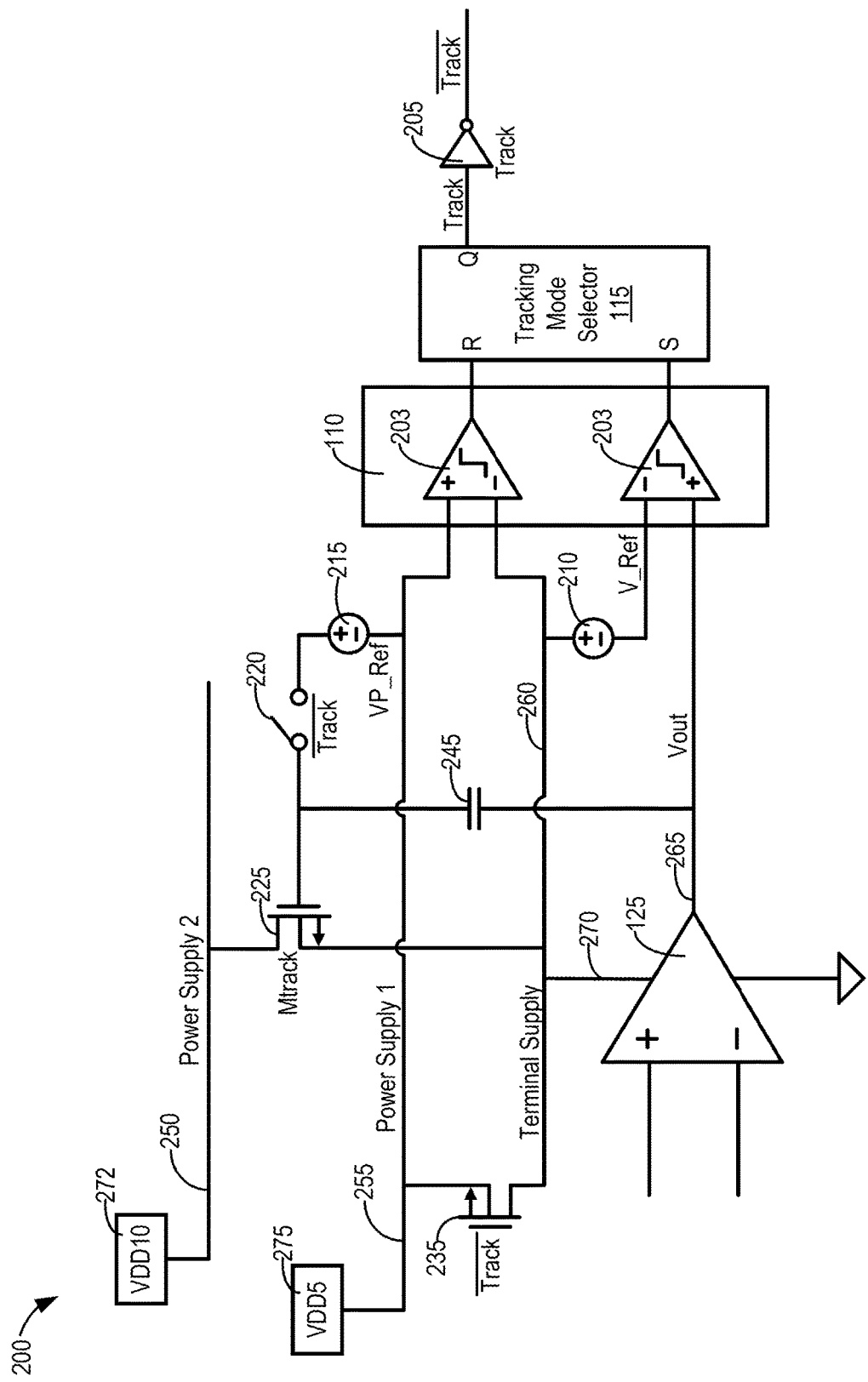
FIG. 2 is a schematic block diagram of the system illustrated in FIG. 1, according to some embodiments.

FIG. 2 depicts a schematic diagram 200 including elements of the system 100, according to some embodiments. The schematic diagram 200 includes the comparators 110, the tracking mode selectors 115, the driver 125, and the components 130. The comparators 110 can include one or more Opamps 203 and/or one or more comparator circuits 203 (e.g., comparators 203). For example, as shown in FIG. 2, the comparators 110 include a first comparator 203 and a second comparator 203. In some embodiments, at least one of the first comparator 203 and/or the second comparator 203 can perform similar functions to that of the comparators 110. The first comparator 203 and the second comparator 203 can both receive one or more signals. The first comparator 203 and the second comparator 203 can also both provide one or more signals.

The first comparator 203 is shown electrically coupled with a power source 275 or source 275, via a supply line 255, and electrically coupled with a supply line 260. The source 275 can be and/or include at least one power supply 120. The source 275 can also be or include at least one of power supplies, power sources, and/or sources described herein. FIG. 2 illustrates the source 275 providing an amount of voltage including a voltage level of VDD5. The amount of voltage provided by the source 275 is illustrated as Power Supply 1 in FIG. 2. The Power Supply 1 signal can be and/or include the first Supply Signal described herein. For example, the Power Supply 1 signal can be and/or include the first level of the first Supply Signal.

The supply line 260 is also shown to be electrically coupled with a terminal 270 of the driver 125. The terminal 270 can be and/or include at least one of the terminals, supply terminals, and/or input terminals described herein. Power provided and/or produced by at least one of the sources described herein can be transmitted by the supply line 260. The amount of voltage transmitted by the supply line 260 is illustrated as Terminal Supply in FIG. 2. The Terminal Supply can be and/or include the second Supply Signal described herein.

The first comparator 203 may receive a signal to indicate an amount of voltage provided by a first source. For example, the first comparator 203 may receive the Power Supply 1 signal. The first comparator 203 may also receive a signal to indicate an amount of voltage provided to a driver. For example, the first comparator 203 may receive the Terminal Supply signal. The first comparator 203 can compare the Power Supply 1 signal with the Terminal Supply signal to determine which signal is larger and/or smaller. The first comparator 203 can provide a signal to indicate the difference between the Power Supply 1 signal and the Terminal Supply signal (e.g., the first Comparison Signal). The first Comparison Signal can be provided to an R terminal of the tracking mode selectors 115.

The second comparator 203 is shown electrically coupled with the driver 125, via a supply line 265, and electrically coupled with the supply line 260. The supply line 265 is also shown to be electrically coupled with an output terminal of the driver 125. An amount of voltage provided by the driver 125 can be transmitted as a signal along the supply line 265. The signal transmitted along the supply line 265 can be and/or include the first Output Signal described herein. The signal transmitted along the supply line 265 is shown to include a voltage level of Vout.

The second comparator 203 may receive a signal to indicate an amount of voltage provided by the driver. For example, the second comparator 203 may receive, via the supply line 265, the first Output Signal. The second comparator 203 may also receive a signal to indicate the amount of voltage provided to the driver. For example, the second comparator 203 cam receive, via the supply line 260, the Terminal Supply signal. The second comparator 203 can compare the first Output Signal with the Terminal Supply signal to determine which is signal is larger and/or smaller. The second comparator 203 can provide a signal to indicate the difference between the first Output Signal and the Terminal Supply signal (e.g., the second Comparison Signal). The second Comparison Signal can be provided to an S terminal of the tracking mode selectors 115.

The second comparator 203 is shown electrically coupled with a voltage offset 210. The voltage offset 210 may include power supply 210. The power supply 210 can be electrically coupled with the supply line 260. The power supply 210 may electrically couple the second comparator 203 with the supply line 260. The power supply 210 can be and/or include at least one of the power sources and/or power supplies described herein. The power supply 210 is shown to include a voltage level of V_Ref. The orientation and/or the placement of the power supply 210 between the supply line 260 and the second comparator 203 may result in the power supply 210 adjusting the level of the Terminal Supply signal that is received by the second comparator 203. For example, the power supply 210 may adjust the Terminal Supply signal (received by the second comparator 203) from a first level (e.g., Terminal Supply) to a second level (e.g., Terminal Supply-V_Ref).

The power supply 210 can produce, responsive to adjusting the Terminal Supply signal from the first level to the second level, a threshold between the Terminal Supply signal and the first Output Signal. The threshold between the Terminal Supply signal and the first Output signal can result in the tracking mode selectors 115 determining that the first Output Signal is larger than the Terminal Supply signal prior to the level of the first Output Signal actually being larger than the level of the Terminal Supply signal. For example, the Terminal Supply signal may include a voltage level of 5V (e.g., VDD5 provided by the source 275) and the first Output Signal may include a voltage level of 4.5. However, the voltage level of the Terminal Supply signal received by the second comparator 203 may include a voltage level of 5V-V_Ref. In this example, based on the voltage level of V_Ref, the second comparator 203 may determine that the first Output Signal is larger than the Terminal Supply signal prior to the voltage level of the first Output Supply signal exceeding the voltage level of the Terminal Supply signal. The threshold produced by the power supply 210 may result in the device 105 increasing the amount of voltage provided to the driver 125 (e.g., terminal 270) prior to the amount of voltage produced by the driver 125 exceeding its supply (e.g., Terminal Supply). For example, the tracking mode selectors 115 can produce signals to increase the amount of voltage provided to the terminal 270 from Power Supply 1 to an amount of voltage provided by a source 272.

The source 272 can be and/or include at least one power supply 120. The source 272 can also be and/or include at least one of the power supplies, the power source, or the sources described herein. FIG. 2 illustrates the source 272 providing an amount of voltage including a voltage level of VDD10. The amount of voltage provided by the source 272 is illustrated as Power Supply 2 in FIG. 2. The Power Supply 2 signal can be and/or include the first Supply Signal described herein. For example, the Power Supply 2 signal can be and/or include the second level of the first Supply Signal.

The tracking mode selectors 115 can receive one or more signals from the comparators 203. For example, the tracking mode selectors 115 can receive the first Comparison Signal and the second Comparison signal. As illustrated in FIG. 2, the tracking mode selectors 115 are shown as an SR Flip-Flop. While shown as an SR Flip-Flop the tracking mode selectors 115 can also be and/or include several other types of Flip-Flops and/or digital signal processors. The tracking mode selectors 115 can maintain, store, and/or otherwise keep state information pertaining to the first Comparison Signal and the second Comparison Signal. For example, the R terminal and the S terminal can be set to low (e.g., set to zero) and/or high (e.g., set to one), and the output terminal (e.g., Q terminal) can maintain either a low value (e.g., zero) and/or a high value (e.g., one) based on how the tracking mode selectors 115 is configured. The output of the Q terminal is shown to be electrically coupled with a NOT gate 205. The output of the Q terminal is shown as Track. The output of the Q terminal can be or include the Track Signals described herein. The NOT gate 205 can invert the output of the Q terminal. The output of the NOT gate 205 is illustrated as Track. The Track signal illustrated in FIG. 2 can be and/or include the Track Signals described herein.

As a non-limiting example, the first Comparison Signal can be low and the second Comparison Signal can be high. Given the R terminal and the S terminal having been set low the first Comparison Signal can keep the R signal low and the second Comparison Signal can set the S terminal high. This can cause the Q terminal to go high and the Q terminal can stay high while the R terminal remains unchanged (e.g., no change in the first Comparison Signal). The output of the Q terminal (e.g., a high signal) can be provided to the NOT gate 205 and the NOT gate 205 can invert the signal (e.g., set the Track signal to 0).

The schematic diagram is shown to include at least one switch 220 and at least one transistor 230 (shown as MOSFETs). The switch 220 and the transistors 230 can be controllable by the Track Signals provided by the tracking mode selectors. FIG. 2 shows the switch 220 and the transistors 230 as being controllable by the Track signal. The value of the Track Signals (e.g., low or high) can impact the switches 220 and the transistor 235. For example, the Track Signals going from low to high may cause the switch 220 to move from an open position to a closed position. As another example, the switch 220 may move from a closed position to an open position as a result of a change in the value of the Track Signals.

The Track Signals may adjust the flow of current through the transistors 235. For example, current through the transistor 235 can have a first path with the Track Signal set to high and current through the transistor 235 can have a second path with the Track signal set to low. The path of the current through the transistors can impact a level of the Terminal Supply signal and/or a level of the first Output Supply Signal. For example, the transistor 235 can electrically couple the source 275 with the supply line 260 when the Track Signal has a first level. The transistor 235 electrically coupling the source 275 with the supply line 260 can result in the source 275 providing a first level of the amount of voltage provided to the terminal 270 (e.g., the Terminal Supply signal includes a voltage level similar to the voltage level VDD5). The amount of voltage provided to the terminal 270 of the driver 125 can also impact the amount of voltage provided by the driver 125 (e.g., the first Output Supply signal) as the amount of voltage provided by the driver 125 may not be able to exceed the amount of voltage provided to the driver 125 (e.g., a voltage level of the Terminal Supply signal).

The switch 220 can electrically couple the first comparator 203 with a voltage offset 215. The voltage offset 215 may include power supply 215. The power supply 215 is shown to include a voltage level of VP_Ref. The switch 220 can electrically couple the first comparator 203 with the power supply 215 based on a level of the Track Signal. For example, when the Track Signal has a level to indicate tracking the difference between the Power Supply 1 signal and the Terminal Supply, the level of the track signal can result in the switch 220 electrically coupling the first comparator 203 with the power supply 215. The switch 220 can electrically couple the first comparator 203 with the power supply 215 to adjust the level of the Power Supply 1 signal from a first level (e.g., VDD5) to a second level (e.g., VDD5+VP_Ref).

The switch 220 can produce, responsive to adjusting the power Supply 1 signal from the first level to the second level, a threshold between the Power Supply 1 signal and the Terminal Supply signal. The threshold produced by the transistor switch can have a similar impact between the Power Supply 1 signal and the Terminal Supply signal to that of the threshold produced by the power supply 210. For example, the threshold between the Power Supply 1 signal and the Terminal Supply signal can result in the first comparator 203 determining that the level of the Power Supply 1 signal is larger than the level of the Terminal Supply signal prior to the Power Supply 1 signal exceeding the Terminal Supply signal.

The schematic diagram 200 can include Mtrack. Mtrack is shown to include transistor 225. The schematic diagram 200 may also include Mreset. Mreset can be or include the switch 220. Mtrack can refer to and/or include a path taken while the device 105 is tracking the difference between the level of the Terminal Supply signal and the level of the first Output Signal as the level of the Terminal Supply signal is increased from VDD5 to VDD10. For example, the Terminal Supply signal can have a voltage level of VDD5 and the comparators 110 can compare the difference between VDD5 and the first Output Signal to determine when to switch the amount of voltage provided to the driver 125 from the source 275 to the source 272. When the comparators 110 indicate that the first Output Signal is larger than the Terminal Supply signal the transistor 225 can electrically couple the source 272 with the supply line 260 and the transistor 235 can electrically decouple the source 275 from the supply line 260. The amount of voltage provided to the terminal of the driver 125 can change from VDD5 to VDD10.

Mreset can refer to and/or include a path taken to reset the components that were impacted and or changed based on the device 105 increasing the voltage level of the Terminal Supply from VDD5 to VDD10. For example, Mreset can electrically decouple the source 272 from the supply line 260 and Mreset can electrically couple the source 275 with the supply line 260. Mreset may also return the terminals (e.g., the R terminal and the S terminal) of the tracking mode selectors 115 to their initial configuration or setting. FIG. 2 depicts an example of the schematic diagram 200 have a single side tracking configuration as the input to the positive supply terminal of the driver 125 can be adjusted (e.g., the source 275 or the source 272 provides an amount of voltage to the terminal 270) and the supply to the negative supply terminal of the driver 125 is maintained.

The configuration, layout, design, and/or arrangement of the components, as shown in FIG. 2, can be beneficial for use in systems that include one or more drivers and/or multiple channels as the supply terminal for each additional driver (e.g., one or more second drivers 125) can be electrically coupled with the supply line 260 (e.g., Terminal Supply), and a respective device 105 can be electrically coupled with the one or more second drivers 125 similar to that shown in FIG. 2. The schematic diagram 200 can include at least one capacitor 245 and the capacitor 245 can provide an AC voltage across the supply line 265. As more drivers 125 may be added to the schematic diagram 200 the capacitor 245 may be able to maintain its performance without the addition of extra capacitors 245.

While FIG. 2 depicts an example of the schematic block diagram 200 including two sources (e.g., the source 272 and the source 275), the schematic block diagram 200 may include different numbers of sources. For example, the schematic block diagram 300 may include less than two sources and/or the schematic diagram 300 may include more than two sources. In some embodiments, the schematic block diagram 200 may include a plurality of sources and the plurality of sources may provide various bracketing levels. For example, the schematic diagram may include three sources and each of the sources may have a given voltage level. To continue this example a first source may have a voltage level of 1V, a second source may have a voltage level of 5V, and a third source may have a voltage level of 10V. In some embodiments, the first source may electrically couple with the driver 125 responsive to Vout having an absolute value voltage level that is less than 1V. In some embodiments, the second source may electrically couple with the driver 125 responsive to Vout having an absolute value voltage level that is greater than 1V and less than 5V. In some embodiments, the third source may electrically couple with the driver 125 responsive to Vout having an absolute value voltage level that is greater than 5V.

Figure 3:
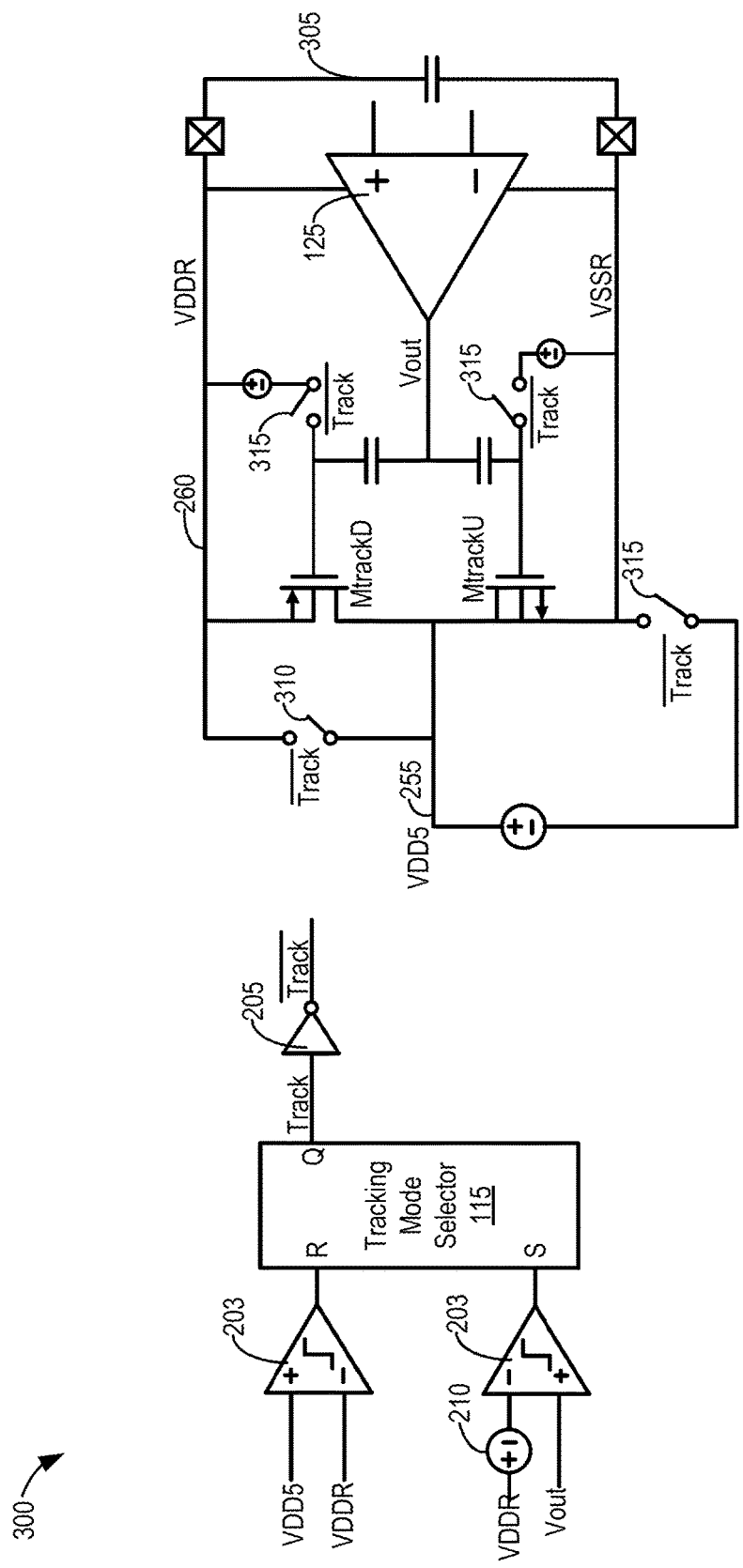
FIG. 3 is a schematic block diagram of the system illustrated in FIG. 1, according to some embodiments.

FIG. 3 depicts a schematic block diagram 300 including elements of the system 100, according to some embodiments. The first comparator 203 can receive a signal from VDD5 and the first comparator 203 can receive a second signal from VDDR. The VDD5 signal may include the Power Supply 1 signal. The VDDR signal may include the Terminal Supply signal. The first comparator 203 can provide a signal to the tracking mode selectors 115. The signal can be a comparison of the VDD5 signal and the VDDR signal.

The schematic diagram 300 can include at least one capacitor 305. The capacitor 305 can be used to increase, lift, modify and/or otherwise change the amount of voltage provided to the supply terminal of the driver 125. The capacitor 305 can replace, supplement, and/or otherwise perform a similar function to that of the source 272, the second power source, and/or the second power supply described herein. The capacitor 305 can provide a voltage to VDDR and the voltage provided by the capacitor 305 to VDDR can be applied to the supply terminal of the driver 125.

The schematic diagram 300 can include one or more switches (e.g., switches 310 and 315). The switches 310 and the switches 315 are shown to be controllable by the inverse of the Track Signal. The schematic diagram 300 can also include MtrackD and MtrackU. MtrackD and/or MtrackU can be or include the Mtrack described herein.

The configuration, layout, design, and/or arrangement of the components, as shown in FIG. 3, can be beneficial for use in systems that include a certain amount of drivers and/or a certain amount of channels as each driver 125 that may be added to the schematic diagram 300 may require its own capacitor 305 and the addition of multiple capacitors 305 in the schematic diagram 300 may increase an amount of space to house (e.g., on a chip) the elements of the schematic diagram 300.

Figure 4:
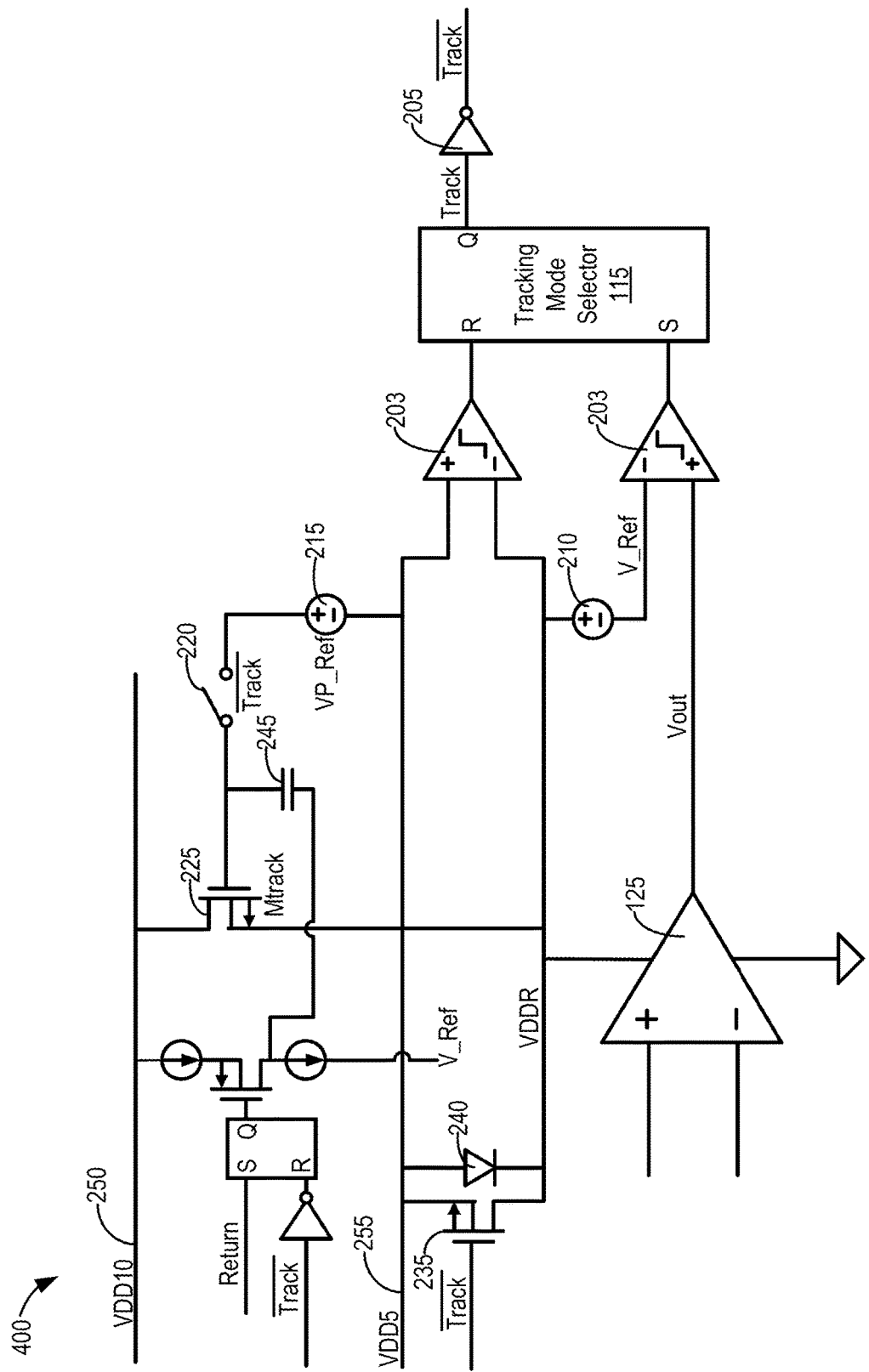
FIG. 4 is a schematic block diagram of the system illustrated in FIG. 1, according to some embodiments.

FIG. 4 depicts a schematic block diagram 400, according to some embodiments. The schematic block diagram 400 can include at least elements illustrated in FIG. 1 and/or FIG. 2. The first comparator 203 can receive a first signal from VDD5 and the first comparator 203 can receive a second signal from VDDR. The first comparator 203 can produce a third signal corresponding to at least one of the first signal or the second signal. The third signal can be provided to the tracking mode selectors 115. The second comparator 203 can receive a fourth signal from the driver 125 and the second comparator 203 can receive a fifth signal corresponding to the second signal. The second comparator 203 can produce a sixth signal corresponding to at least one of the fourth signal or the fifth signal. The sixth signal can be provided to the tracking mode selectors 115.

Figure 5:
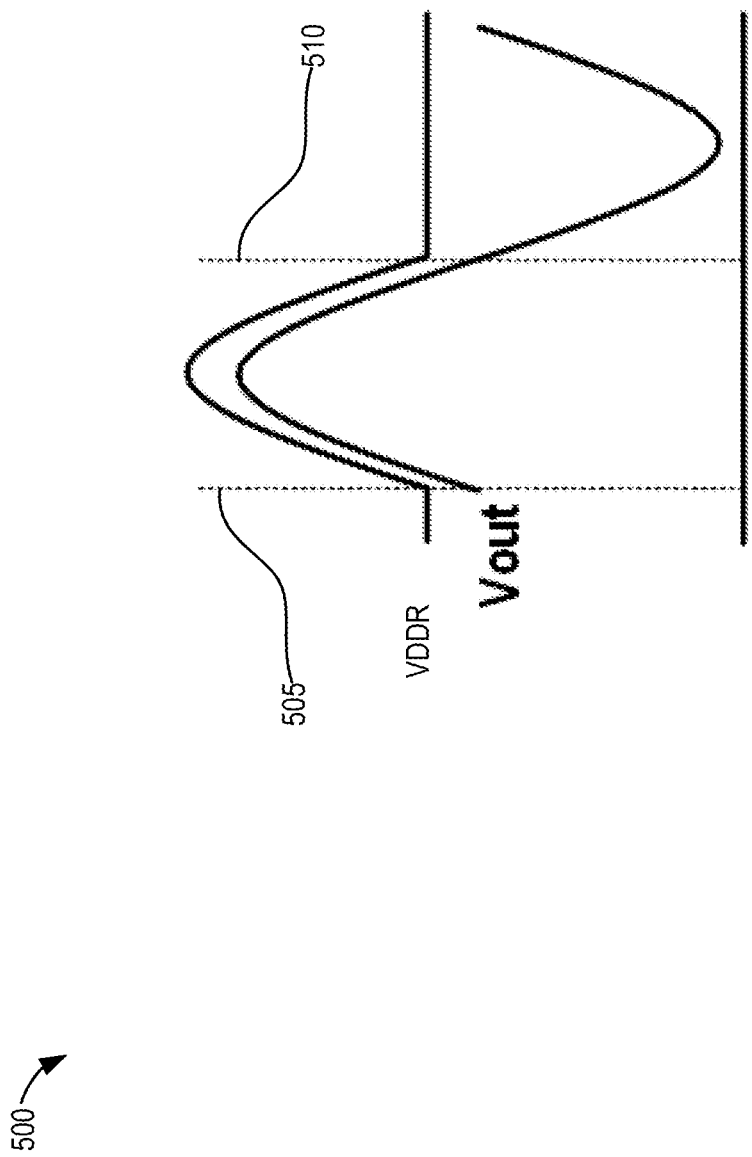
FIG. 5 is a graph illustrating signals provided to components of the system illustrated in FIG. 2, according to some embodiments.

FIG. 5 depicts a graph 500, according to some embodiments. The graph 500 can include a signal indicating an amount of voltage provided to a terminal of a driver. The amount of voltage is shown to include a voltage level of VDDR. The graph can include a signal indicating an amount of voltage provided by the driver. The signal is shown to include a voltage level of Vout. The signal having the voltage level of VDDR can be and/or include the Terminal Supply signal. The signal including the voltage level of Vout can be and/or include the first Output Signal. The graph 500 can include at least one line 505 and at least one line 510. The area between the line 505 and the line 510 can represent, indicate, and/or otherwise pertain to when the device 105 is tracking the output of the driver 125. For example, the graph 500 can include signals produced and/or provided by some of the elements illustrated in FIG. 2.

Figure 6:
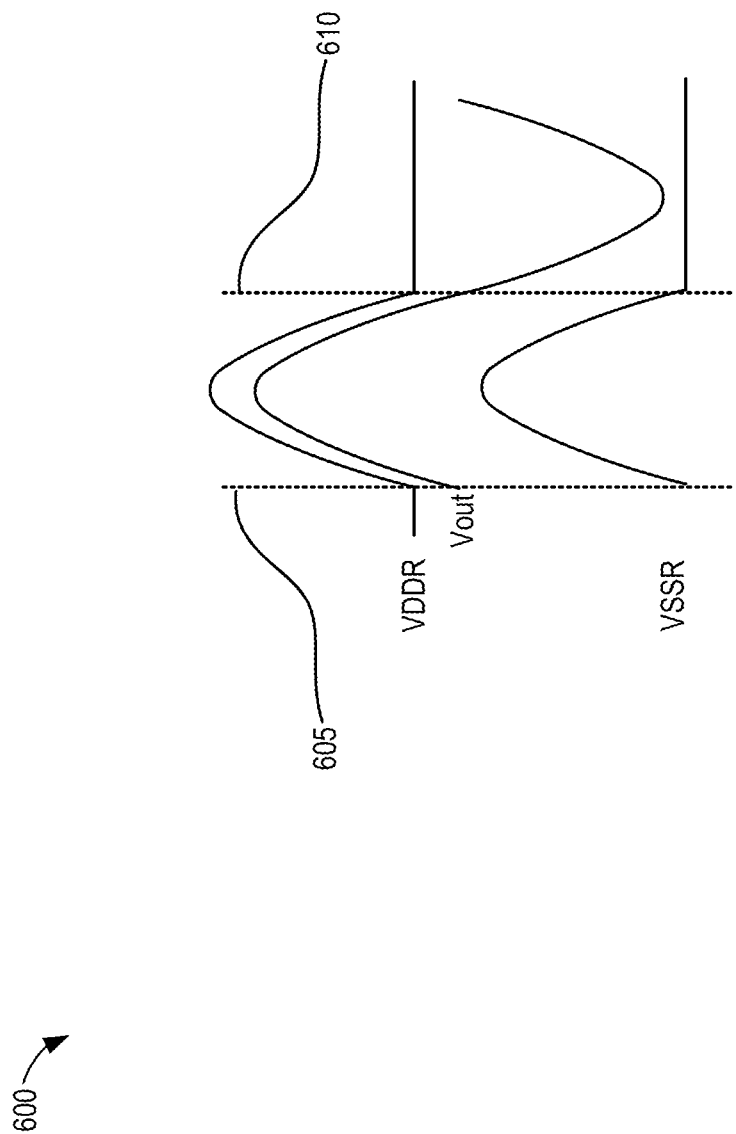
FIG. 6 is a graph illustrating signals provided to components of the system illustrated in FIG. 3, according to some embodiments.

FIG. 6 depicts a graph 600, according to some embodiments. The graph 600 can include a signal indicating VDDR, a signal indicating Vout, and a signal indicating VSSR. The area between line 605 and line 610 can represent, indicate, and/or otherwise pertain to when the device 105 is tracking the output of the driver 125. The graph 600 illustrates an example of the elements of schematic diagram 300 performing a dual side tracking as the output value of VDDR and VSSR are controlled. FIG. 6 shows the value of the VDDR increasing (while the output is being tracked) and once the output returns to a baseline that the VDDR also returns to its baseline value.

Figure 7:
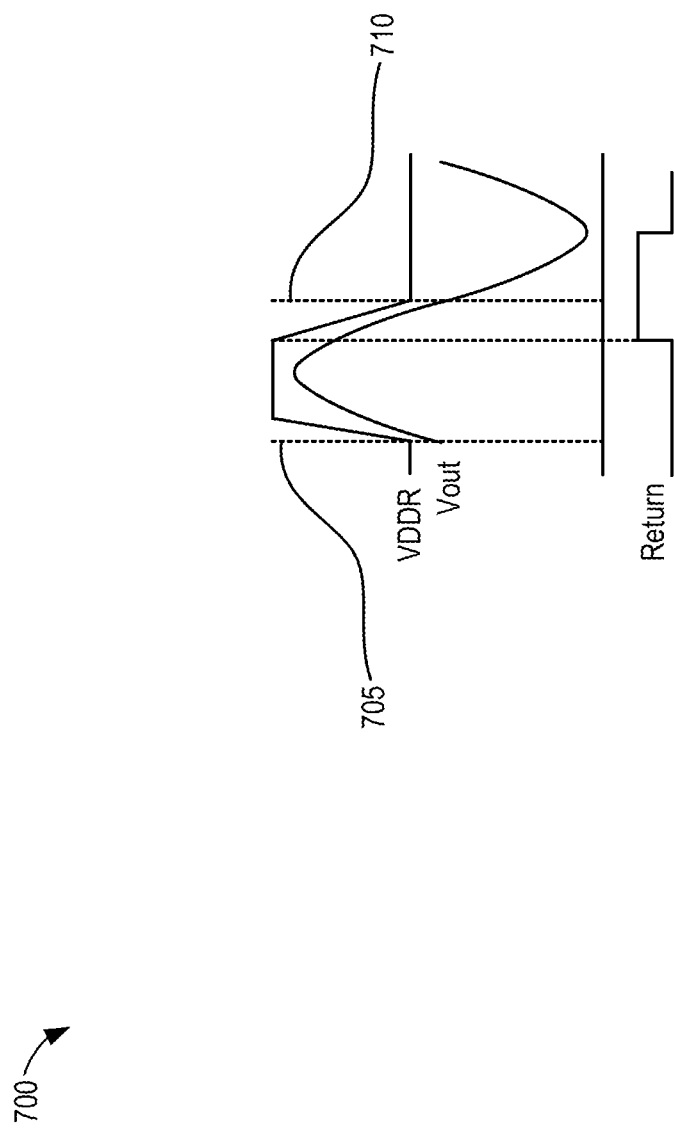
FIG. 7 is a graph illustrating signals provided to components of the system illustrated in FIG. 4, according to some embodiments.

FIG. 7 depicts a graph 700, according to some embodiments. The graph 700 can include a signal indicating VDDR and a signal indicating Vout. The graph 700 can include at least one line 705 and at least one line 710. The area between the lines 705 and 710 can represent, indicate, and/or otherwise pertain to when the device 105 (as illustrated in FIG. 4) is tracking the output of the driver 125. For example, the graph 700 can correspond to signals produced and/or provided by elements of the schematic diagram 400.

Figure 8:
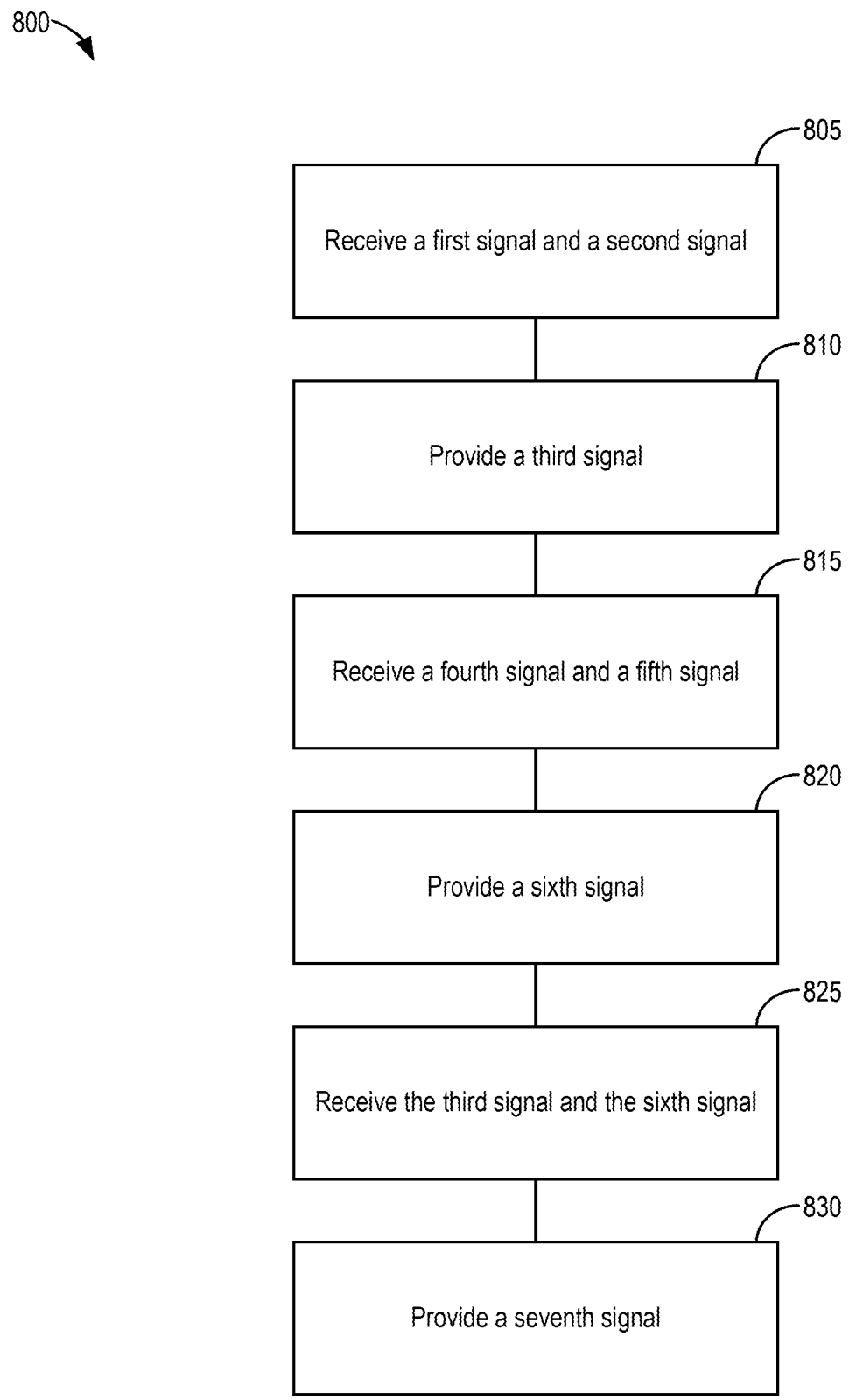
FIG. 8 is a block diagram of a process of tracking output signals, according to some embodiments.

FIG. 8 depicts a block diagram of a process 800 for tracking signals of a driver, according to some embodiments. At least one step of the process 800 can be performed by at least one of component of the system 100. For example, the tracking mode selectors 115 can perform and at least one step of the process 800. At least one step of the process 800 can be performed by at least one element of the schematic diagram 200, the schematic diagram 300, and/or the schematic diagram 400. For example, the first comparator 203 can perform at least one step of the process 800. While the steps included in the process 800 are described in a certain order, the order of the steps included in the process 800 can be performed simultaneously, modified, reorganized, and/or otherwise changed.

At step 805, a first signal and a second signal can be received. For example, the first signal and the second signal can be received by the comparators 110. The first signal may be the Power Supply 1 signal described herein. The second signal may be the Terminal Supply signal described herein. The first signal may indicate an amount of voltage provided by a source. For example, the first signal may indicate the amount of voltage provided by the source 272. The second signal may indicate an amount of voltage provided to the driver. For example, the second signal may indicate the amount of voltage provided to the terminal 270 of the driver 125. In some embodiments, the first signal and the second signal can be received by the first comparator 203.

At step 810, a third signal can be provided. For example, the third signal may be provided by the comparators 110. The third signal may be the first Comparison Signal described herein. The third signal can be provided to the tracking mode selectors 115. The third signal can indicate a difference between the first signal and the second signal (e.g., a difference between the signals received in step 805). For example, the comparators 110 can compare a voltage level of the first signal to a voltage level of the second signal. The third signal can have a first level when a level of the first signal is larger than a level of the second signal. The third signal can have a second level when the level of the second signal is larger than the level of the first signal. In some embodiments, the third signal can be provided by the first comparator 203.

At step 815, a fourth signal and a fifth signal can be received. For example, the fourth signal and the fifth signal can be received by the comparators 110. The fourth signal may be the first Output Signal described herein. The fifth signal may be the Terminal Supply signal described herein. The fourth signal may indicate an amount of voltage provided by the driver. For example, the fourth signal may indicate the amount of voltage provided by the driver 125 (e.g., Vout). The fifth signal may indicate an amount of voltage provided to the driver. For example, the fifth signal may indicate the amount of voltage provided to the terminal 270 of the driver 125. In some embodiments, the fourth signal and the fifth signal can be received by the second comparator 203.

At step 820, a sixth signal can be provided. The sixth signal can be provided by the comparators 110. The sixth signal may be the second Comparison Signal described herein. The sixth signal can be provided to the tracking mode selectors 115. The sixth signal can indicate a difference between the fourth signal and the fifth signal (e.g., a difference between the signals received in step 815). For example, the comparators 110 can compare a voltage level of the fourth signal to a voltage level of the fifth signal. The sixth signal can have a first level when a level of the fourth signal is larger than a level of the fifth signal. The sixth signal can have a second level when the level of the fifth signal is larger than the level of the fourth signal. In some embodiments, the sixth signal can be provided by the second comparator 203.

At step 825, the third signal and the sixth signal can be received. For example, the tracking mode selectors 115 can receive the third signal and the sixth signal. In some embodiments, the tracking mode selectors 115 may receive the third signal and the sixth signal from the comparators 110. In some embodiments, the tracking mode selectors 115 may receive the third signal from the first comparator 203 and receive the sixth signal from the second comparator 203.

At step 830, a seventh signal can be provided. The seventh signal can be provided by tracking mode selectors 115. The seventh signal may refer to the Track Signal described herein. The seventh signal can be provided to the components 130. The seventh signal can indicate when to track a difference between the amount of voltage provided to the driver 125 and the amount of voltage provided by the driver 125. The seventh signal can also indicate when to track a difference between the amount of voltage provided by the source 275 and the amount of voltage provided to the driver 125.

The hardware systems described herein may be implemented in many different ways and in many different combinations of hardware and software and circuit designs. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLO), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. In some embodiments, the circuitry can be provided on one or more integrated circuit dies in an integrated circuit package. The integrated circuit package can be a combination of two or more packages in some embodiments.

The circuitry may further include or access instructions (e.g., software or firmware) for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HOD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A system, comprising:
a device including:
a first circuit configured to:
receive a first signal to indicate a first amount of voltage provided by a first source;
receive a second signal to indicate a second amount of voltage provided to a driver; and
provide a third signal having a first level in response to a level of the first signal being larger than a level of the second signal and the third signal having a second level in response to the level of the second signal being larger than the level of the first signal;
a second circuit configured to:
receive a fourth signal to indicate a third amount of voltage provided by the driver;
receive a fifth signal to indicate the second amount of voltage; and
provide a sixth signal having a first level in response to a level of the fourth signal being larger than a level of the fifth signal and the sixth signal having a second level in response to the level of the fifth signal being larger than the level of the fourth signal;
a third circuit configured to:
receive the third signal and the sixth signal; and
provide a seventh signal to indicate whether to:
track a difference between the second amount of voltage and the third amount of voltage; or
track a difference between the first amount of voltage and the second amount of voltage;
a first component configured to electrically couple the driver with the first source in response to the seventh signal having a first level; and
a second component configured to electrically couple the driver with a second source in response to the seventh signal having a second level.

2. The system of claim 1, comprising:
the first source configured to:
electrically couple with a terminal of the driver; and
provide a first level of the second amount of voltage; and
the second source configured to:
electrically couple with the terminal of the driver; and
provide a second level of the second amount of voltage.

3. The system of claim 2, wherein:
the level of the second signal has a first level in response to the first source providing the first level of the second amount of voltage;
the second signal has a second level in response to the second source providing the second level of the second amount of voltage; and
the second level of the second signal is larger than the first level of the second signal.

4. The system of claim 2, comprising:
the first component, in response to the seventh signal having the second level, configured to:
electrically decouple the second source from the terminal of the driver; and
electrically couple the first source with the terminal of the driver; and
the second circuit configured to:
receive the fourth signal in response to the first source providing the first level of the second amount of voltage or in response to the second source providing the second level of the second amount of voltage.

5. The system of claim 1, wherein:
the fourth signal has a first range in response to the first source providing a first level of the second amount of voltage;
the fourth signal has a second range in response to a second source providing a second level of the second amount of voltage; and
the first range different than the second range.

6. The system of claim 1, wherein the second signal indicates a supply voltage for the driver and wherein the supply voltage dictates a range for the driver.

7. The system of claim 1, comprising:
the first component, in response to the seventh signal having the first level, configured to:
electrically couple a third component with the first circuit to adjust the level of the first signal from a first level to a second level; and
produce, responsive to adjustment of the first signal from the first level to the second level, a threshold between the first signal and the second signal.

8. The system of claim 7, comprising:
a fourth component configured to:
electrically couple with the second circuit;
adjust the level of fifth signal from a first level to a second level; and
produce, responsive to adjustment of the fifth signal from the first level to the second level, a threshold between the fifth signal and the fourth signal.

9. The system of claim 1, wherein:
the seventh signal has the first level to indicate tracking the difference between the second amount of voltage and the third amount of voltage; and
the seventh signal has the second level to indicate tracking the difference between the first amount of voltage and the second amount of voltage.

10. A device, comprising:
a first circuit configured to:
receive a first signal to indicate a first amount of voltage provided by a first source;
receive a second signal to indicate a second amount of voltage provided to a driver; and
provide a third signal having a first level in response to a level of the first signal being larger than a level of the second signal and the third signal having a
second level in response to the level of the second
signal being larger than the level of the first signal;
a second circuit configured to:
receive a fourth signal to indicate a third amount of
voltage provided by the driver;
receive a fifth signal to indicate the second amount of
voltage; and
provide a sixth signal having a first level in response to
a level of the fourth signal being larger than a level
of the fifth signal and the sixth signal having a
second level in response to the level of the fifth
signal being larger than the level of the fourth signal;
a third circuit configured to:
receive the third signal and the sixth signal; and
provide a seventh signal to indicate whether to:
track a difference between the second amount of
voltage and the third amount of voltage; or
track a difference between the first amount of voltage
and the second amount of voltage;
a first component configured to electrically couple the
driver with the first source in response to the seventh
signal having a first level; and
a second component configured to electrically couple the
driver with a second source in response to the seventh
signal having a second level.

11. The device of claim 10, comprising:
the first source configured to:
electrically couple with a terminal of the driver; and
provide a first level of the second amount of voltage;
and
the second source configured to:
electrically couple with the terminal of the driver; and
provide a second level of the second amount of voltage.

12. The device of claim 11, wherein:
the level of the second signal has a first level in response
to the first source providing the first level of the second
amount of voltage;
the second signal has a second level in response to the
second source providing the second level of the second
amount of voltage; and
the second level of the second signal is larger than the first
level of the second signal.

13. The device of claim 11, comprising:
the first component, in response to the seventh signal
having the second level, configured to:
electrically decouple the second source from the terminal of the driver; and
electrically couple the first source with the terminal of
the driver; and
the second circuit configured to:
receive the fourth signal in response to the first source
providing the first level of the second amount of
voltage or in response to the second source providing
the second level of the second amount of voltage.

14. The device of claim 10, wherein:
the fourth signal has a first range in response to the first
source providing a first level of the second amount of
voltage;
the fourth signal has a second range in response to a
second source providing a second level of the second
amount of voltage; and
the first range different than the second range.

15. The device of claim 10, wherein the second signal
indicates a supply voltage for the driver and wherein the
supply voltage dictates a range for the driver.

16. The device of claim 10, comprising:
the first component, in response to the seventh signal
having a first level, configured to:
electrically couple a third component with the first
circuit to adjust the level of the first signal from a
first level to a second level; and
produce, responsive to adjustment of the first signal
from the first level to the second level, a threshold
between the first signal and the second signal.

17. A method for tracking signals of a driver, the method
comprising:
receiving, by a first circuit, a first signal and a second
signal, the first signal to indicate a first amount of
voltage provided by a first source, and the second signal
to indicate a second amount of voltage provided to the
driver;
providing, by the first circuit, a third signal having a first
level in response to a level of the first signal being
larger than a level of the second signal and the third
signal having a second level in response to the level of
the second signal being larger than the level of the first
signal;
receiving, by a second circuit, a fourth signal and a fifth
signal, the fourth signal to indicate a third amount of
voltage provided by the driver, and the fifth signal to
indicate the second amount of voltage;
providing, by the second circuit, a sixth signal having a
first level in response to a level of the fourth signal
being larger than a level of the fifth signal and the sixth
signal having a second level in response to the level of
the fifth signal being larger than the level of the fourth
signal;
receiving, by a third circuit, the third signal and the sixth
signal;
providing, by the third circuit, a seventh signal to indicate
whether to:
track a difference between the second amount of voltage and the third amount of voltage; or
track a difference between the first amount of voltage
and the second amount of voltage;
the level of the second signal has a first level in response
to the first source providing a first level of the second
amount of voltage;
the second signal has a second level in response to a
second source providing a second level of the second
amount of voltage; and
the second level of the second signal is larger than the first
level of the second signal.

18. A system, comprising:
a device including:
a first circuit configured to:
receive a first signal to indicate a first amount of
voltage provided by a first source;
receive a second signal to indicate a second amount
of voltage provided to a driver; and
provide a third signal having a first level in response
to a level of the first signal being larger than a level
of the second signal and the third signal having a
second level in response to the level of the second
signal being larger than the level of the first signal;
a second circuit configured to:
receive a fourth signal to indicate a third amount of
voltage provided by the driver, wherein the fourth
signal has a first range in response to the first
source providing a first level of the second amount
of voltage, wherein the fourth signal has a second
range in response to a second source providing a second level of the second amount of voltage, and wherein the first range is different than the second range;
  receive a fifth signal to indicate the second amount of voltage; and
  provide a sixth signal having a first level in response to a level of the fourth signal being larger than a level of the fifth signal and the sixth signal having a second level in response to the level of the fifth signal being larger than the level of the fourth signal; and
a third circuit configured to:
  receive the third signal and the sixth signal; and
  provide a seventh signal to indicate whether to:
    track a difference between the second amount of voltage and the third amount of voltage; or
    track a difference between the first amount of voltage and the second amount of voltage.

19. A system, comprising:
a device including:
  a first circuit configured to:
    receive a first signal to indicate a first amount of voltage provided by a first source;
    receive a second signal to indicate a second amount of voltage provided to a driver; and
    provide a third signal having a first level in response to a level of the first signal being larger than a level of the second signal and the third signal having a second level in response to the level of the second signal being larger than the level of the first signal;
  a second circuit configured to:
    receive a fourth signal to indicate a third amount of voltage provided by the driver;
    receive a fifth signal to indicate the second amount of voltage; and
    provide a sixth signal having a first level in response to a level of the fourth signal being larger than a level of the fifth signal and the sixth signal having a second level in response to the level of the fifth signal being larger than the level of the fourth signal;
  a third circuit configured to:
    receive the third signal and the sixth signal; and
    provide a seventh signal to indicate whether to:
      track a difference between the second amount of voltage and the third amount of voltage; or
      track a difference between the first amount of voltage and the second amount of voltage; and
  a first component, in response to the seventh signal having a first level, configured to:
    electrically couple a second component with the first circuit to adjust the level of the first signal from a first level to a second level; and
    produce, responsive to adjustment of the first signal from the first level to the second level, a threshold between the first signal and the second signal.

* * * * *